US 6,710,663 B1

(12) United States Patent
Berquist

(10) Patent No.: US 6,710,663 B1
(45) Date of Patent: Mar. 23, 2004

(54) TEMPERATURE COMPENSATION OF A RUBIDIUM FREQUENCY STANDARD

(75) Inventor: Roy W. Berquist, Toddville, IA (US)

(73) Assignee: Rockwell Collins, Cedar Rapids, IA (US)

(*) Notice: Subject to any disclaimer, the term of this patent is extended or adjusted under 35 U.S.C. 154(b) by 0 days.

(21) Appl. No.: 10/280,235

(22) Filed: Oct. 25, 2002

(51) Int. Cl.[7] .............................................. H03L 7/26
(52) U.S. Cl. ........................................................ 331/3
(58) Field of Search ................................... 331/3, 94.1

(56) References Cited

U.S. PATENT DOCUMENTS

| 4,305,041 | A | | 12/1981 | Frerking | ................. | 328/155 |
| 5,606,291 | A | * | 2/1997 | Verbanets | ................. | 331/3 |

* cited by examiner

Primary Examiner—David Mis
(74) Attorney, Agent, or Firm—Nathan O. Jensen; Kyle Eppele

(57) ABSTRACT

A rubidium frequency standard is compensated for frequency variations over temperature by allowing the rubidium frequency standard to vary while holding the output frequency constant. A voltage controlled crystal oscillator, locked to a physics package, provides the output signal. A temperature sensor senses temperature and proves a temperature signal to a microcontroller. A frequency synthesizer receives the output signal from the voltage controlled crystal oscillator as a reference and provides an RF signal to the physics package. The microcontroller looks up a frequency error in a memory in accordance with the temperature signal, generates an offset control word for the frequency synthesizer to compensate for the temperature and adjusts the VCXO with an error signal to compensate for temperature.

18 Claims, 3 Drawing Sheets

TEMPERATURE COMPENSATION OF A RUBIDIUM FREQUENCY STANDARD

BACKGROUND OF THE INVENTION

This invention relates to frequency standards, rubidium frequency standards, and more specifically to temperature compensation of a rubidium frequency standard.

As hopping rates increase in spread spectrum radios such as JTIDS, LINK 16, HAVE QUICK, SINCGARS, and SATURN, time of day clocks are required to become more accurate to insure quick synchronization and longer mission times without synchronization. These radios require very accurate frequency standards that are pressing the limits of oven controlled crystal oscillators (OCXO) and temperature compensated crystal oscillators (TCXO).

Rubidium frequency standards have been known in the art for many years. Rubidium frequency standards provide greater accuracy than OCXO and TCXO frequency standards. Rubidium frequency standards operate by locking a crystal oscillator to a hyperfine transition at 6.834,682,612 GHz in rubidium. The amount of light from a rubidium discharge lamp that reaches a photo detector through a rubidium gas resonance cell is reduced when rubidium vapor in the resonance cell is excited by a microwave signal near the transition frequency. The crystal oscillator is locked to the rubidium transition by detecting the light output drop when sweeping an RF frequency synthesizer containing the crystal through the transition frequency.

Rubidium frequency standards are useful in spread spectrum radios and such systems as GPS to provide high frequency accuracy. However, rubidium frequency standards are large and sensitive to changes in temperature that cause changes in frequency. Rubidium frequency standards also consume large amounts of power.

In a rubidium frequency standard a gas cell, light source, and photo detector are all temperature sensitive and each requires a specific temperature for optimal operation. The optimal temperature for the three devices is not the same so the temperature used is a compromise of the desired temperatures, making the devices more sensitive to external temperature change. The frequency of the rubidium transition is sensitive to the pressure in the gas cell, which changes with temperature. Rubidium's melting point is 34° C. so for rubidium to be in the gaseous state, the temperature of the gas cell must be elevated with an oven. Since there are two different isotopes of rubidium there are two different resonances. A filter cell is used to filter out one resonance. A second cell is used to absorb the light of a rubidium lamp or laser diode. This abortion point is very fine providing a high Q frequency reference. For proper operation the filter cell and the absorption cell must be at a specific temperature and the lamp has its specific temperature to provide a zero light shift/zero temperature coefficient (TC) condition (ZLS/ZTC). Deviation from these ideal temperatures means the rubidium frequency standard becomes more dependent on temperature changes. Different types of light sources have been tried in an effort to minimize the effect of the light shifting.

The TC of the rubidium frequency standard is closely related to how well the ZLS/ZTC temperature can be maintained. As the frequency standard is miniaturized, the cells and the lamp are brought closer meaning their optimal temperatures must be compromised. Also the room for thermal insulation is minimized. In addition the electronics components are brought closer together, concentrating their heat, causing thermal gradients. All this makes it much more difficult to maintain the optimal temperature conditions required for frequency stability.

Previous attempts to stabilize rubidium frequency standards have included ovenization of the components and for even higher stability units double ovenization or cooling by thermal electric cooling. An OCXO is typically used to provide the output frequency. All these attempts occupy large volumes and consume high power in the rubidium frequency standard.

For many applications in GPS and radio communications systems miniaturization and low power consumption are required. The high stability of a rubidium frequency standard is also required. What is needed is a miniaturized rubidium frequency standard with temperature compensation to offer high stability without consuming large amounts of power.

SUMMARY OF THE INVENTION

A rubidium frequency standard with a temperature compensated output signal is disclosed. The rubidium frequency standard has a voltage controlled crystal oscillator (VCXO) that provides the temperature compensated output signal. A frequency synthesizer receives the output signal from the voltage controlled crystal oscillator as a reference and provides a RF signal. A physics package receives the RF signal and provides a light output signal with a null indicating when the RF signal is such that a transition frequency of rubidium is obtained within the physics package. A temperature sensor senses temperature and provides a temperature signal. A microcontroller receives the light output signal, generates a control word for the frequency synthesizer, receives the temperature signal, and provides an error signal to the VCXO to lock the VCXO to the physics package. The microcontroller uses the temperature signal to look up a frequency error in a memory to offset the synthesizer and adjust the VCXO to compensate for temperature.

The physics package further comprises a multiplier to multiplying the RF signal to a microwave frequency, a light source for providing light, a gas cell excited by the microwave frequency that passes the light from the light source and reduces the light from the light source when the gas cell is excited by the microwave frequency at the transition frequency. A photo detector detects the light passed through the gas cell and provides a light output signal that is at the null when the gas cell is excited at the transition frequency.

The microcontroller calculates a offset control word for the frequency synthesizer by use of a temperature versus control word lookup table, sweeps the synthesizer around the offset control word while sampling the photo detector output, detects the null in the photo detector output, and adjusts the VCXO frequency so that the null frequency matches the synthesizer setting that is recorded in the memory. A compensation table is built and stored in the memory that contains the offset control word for the temperature.

During temperature compensation of the rubidium frequency standard a high stability reference oscillator is substituted for the VCXO, the rubidium frequency standard is run over a desired temperature range, and the microcontroller adjusts the synthesizer with a control word to find a null point in the photo detector output and then records the offset control word along with the temperature at which the offset control word was found in the compensation table.

It is an object of the present invention to compensate for frequency variations over temperature in a rubidium frequency standard.

It is an object of the present invention to correct for frequency variations over temperature in a rubidium frequency standard by allowing the rubidium frequency to varying while maintaining a constant output frequency.

It is an advantage of the present invention to allow size reduction of a rubidium frequency standard while maintaining frequency accuracy.

It is an advantage of the present invention to eliminate an oven controlled crystal oscillator.

It is an advantage of the present invention to reduce power consumption in a rubidium frequency standard, It is a feature of the present invention to allow removal of insulation in ovenized components.

It is a feature of the present invention to provide improved frequency accuracy in a compact package with reduced size for radio communications and GPS applications.

BRIEF DESCRIPTION OF THE DRAWINGS

The invention may be more fully understood by reading the following description of the preferred embodiments of the invention in conjunction with the appended drawings wherein.

DETAILED DESCRIPTION

Figure 1:
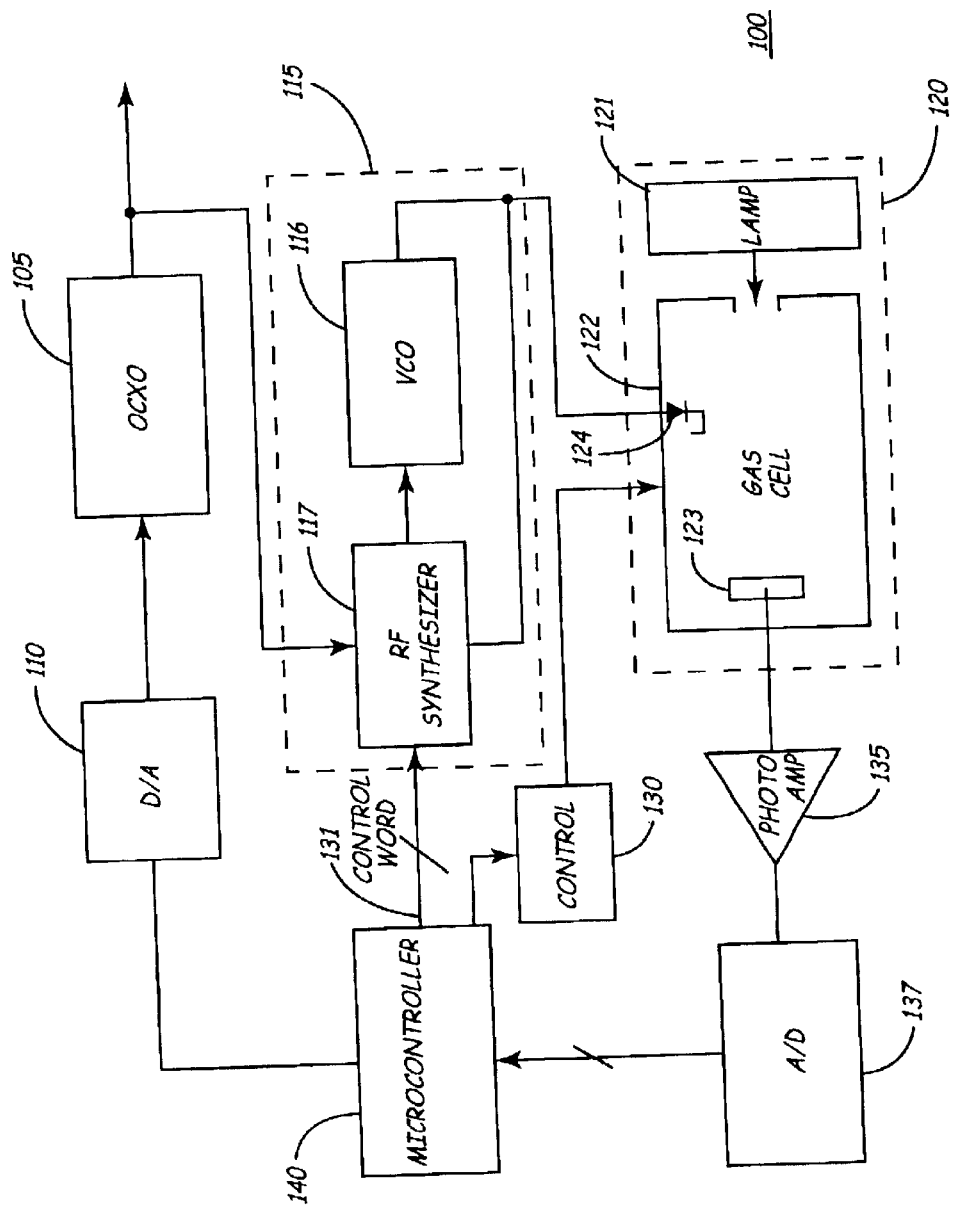
FIG. 1 is a block diagram of a rubidium frequency standard known in the art.

FIG. 1 is a block diagram of a rubidium frequency standard 100 known in the art. Rubidium frequency standards lock a crystal oscillator to the hyperfine transition frequency of 6.8346826128 GHz in rubidium.

The output from the rubidium frequency standard 100 is taken from an oven stabilized crystal oscillator (OCXO) 105. The OCXO 105 is tuned by a digital-to-analog converter 110. The output from the OCXO 105 is also a reference source to a frequency synthesizer 115 that provides an RF signal to a physics package 120. The RF signal is multiplied in the physics package 120 by a multiplier such as a step recovery diode 124 to provide the microwave frequency (6.834 GHz) to a rubidium gas cell 122 in the physics package 120.

The physics package 120 also contains a light source 121 that provides light that is passed through the rubidium gas cell 122 and sensed by a photo detector 123. The light source 121 operates at about 150 MHz and is driven by an oscillator (not shown). The resonance gas cell 122 is inside a magnetic shield to reduce frequency pulling effects of external magnetic fields. The apparent hyperfine transition frequency may be tuned by a magnetic field coil (not shown) in the physics package 120.

The frequency synthesizer 115 has a very fine step size and a low phase noise output. The frequency synthesizer 115 utilizes a dual loop design. An inner loop consists of a VCO 116 that provides the RF signal to the physics package 120 and that is phase locked to a crystal oscillator (not shown) in an RF synthesizer 117. An outer loop compares the RF signal frequency to the OCXO 105 output in RF synthesizer 117. The outer loop provides high resolution by dividing the RF signal and the OCXO 105 output by large numbers. The outer loop keeps the inner loop crystal oscillator locked to the OCXO 105 output reference. The frequency synthesizer 115 is set to a frequency above the apparent hyperfine transition for the physics package 120. The magnetic field coil is used to tune the physics package 120 apparent hyperfine transition frequency to the synthesizer frequency. A magnetic field control signal comes from a control function 130 connected to a microcontroller 140.

A low frequency sine wave modulating signal (typically 70 Hz) is used to phase modulate the inner loop by varying a control word 131 to the RF synthesizer 117 from the microcontroller 140. This generates an RF output from the VCO 116, which when multiplied to 6.834 GHz in the gas cell 122, sweeps with an approximate 300-Hz deviation around the hyperfine transition frequency. By sweeping through the transition at 70 Hz, the output from the photo detector 123 has an ac component at 140 Hz, when centered on the transition frequency. The phase of the 70-Hz component is used to determine if the RF output is above or below the transition frequency.

The microcontroller 140 generates the 70-Hz phase modulation of the RF signal that excites the physics package and detects the amplitude and phase of the 70-Hz and 140-Hz signals from the photo detector 123. The microcontroller 140 also provides an error signal to lock the OCXO 105 to the rubidium hyperfine transition. The 70-Hz digitally synthesized phase modulation waveform is generated by varying a control word input to frequency synthesizer 117 as discussed above. The photo detector 123 signal is amplified and bandpass filtered in photo amp 135 before being converted by an analog to digital converter (A/D) 137.

Figure 2:
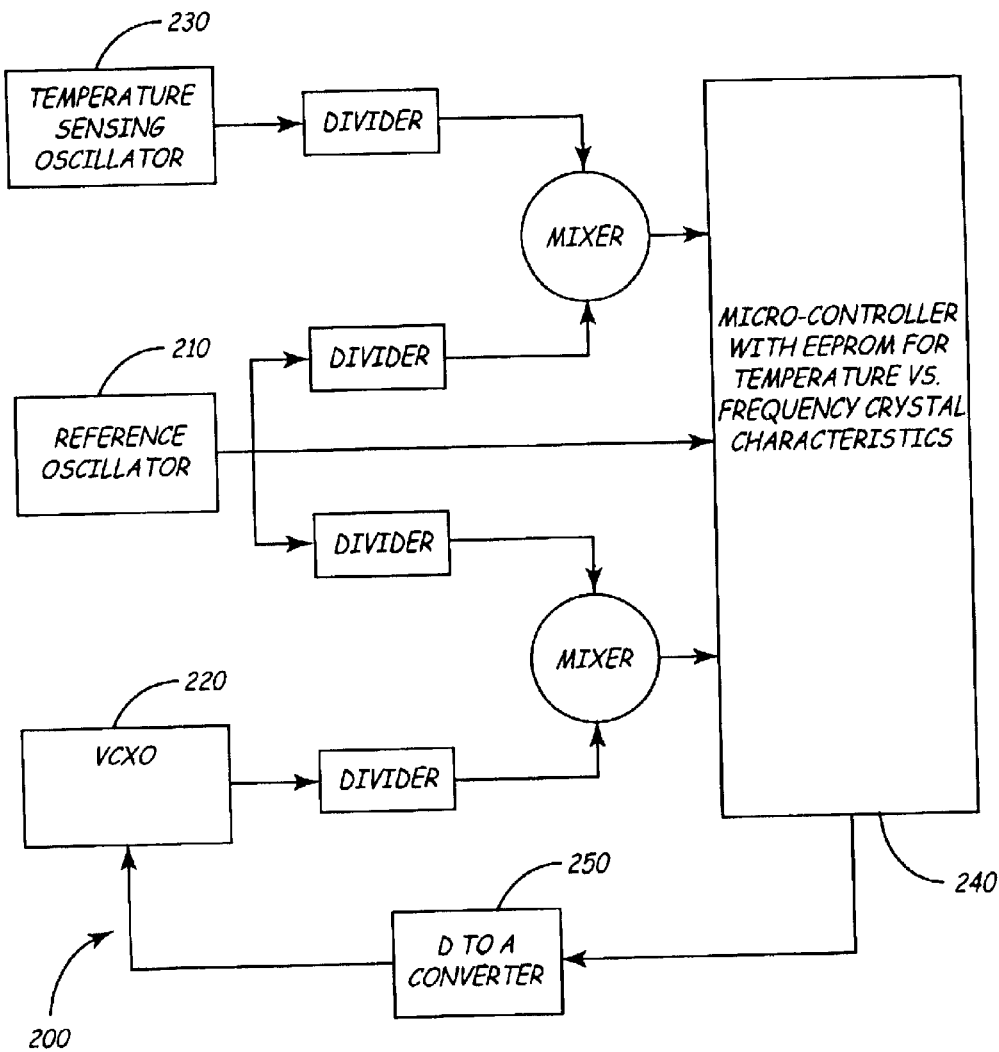
FIG. 2 is a block diagram of a time compensated clock oscillator (TCCO) technique that the basis for a temperature stabilization scheme of a rubidium standard in the present invention.

A time compensated clock oscillator (TCCO) technique forms the basis for temperature stabilization of a rubidium standard in the present invention. The TCCO patented by the assignee of the present invention as U.S. Pat. No. 4,305,041, is incorporated by reference in its entirety. FIG. 2 is a block diagram of a TCCO 200. In this type of compensation a crystal oscillator with low temperature hysteresis is used as a reference oscillator 210. The reference oscillator 210 is not compensated for temperature, but its frequency is characterized over temperature and stored in a nonvolatile memory in a microcontroller 240. In the reference oscillator 210 a crystal is a third overtone SC cut crystal with a Q well over two million. Since this crystal can not be pulled to frequency a second oscillator, a voltage controlled crystal oscillator (VCXO) 220 is used to provide a frequency output. The microcontroller 240 measures the VCXO 220 frequency using the SC-cut crystal as the reference and also at the same time the temperature of the SC-cut crystal by using a temperature sensing oscillator 230. The microcontroller 240 then calculates the reference oscillator 210 frequency using a look up table in with the reference crystal's temperature-frequency characteristics in a nonvolatile memory EEPROM in the microcontroller 240. With this information the microcontroller 240 then calculates the VCXO 220 frequency error and corrects an output word to a digital to analog converter 250 that corrects the VCXO 220 frequency.

Figure 3:
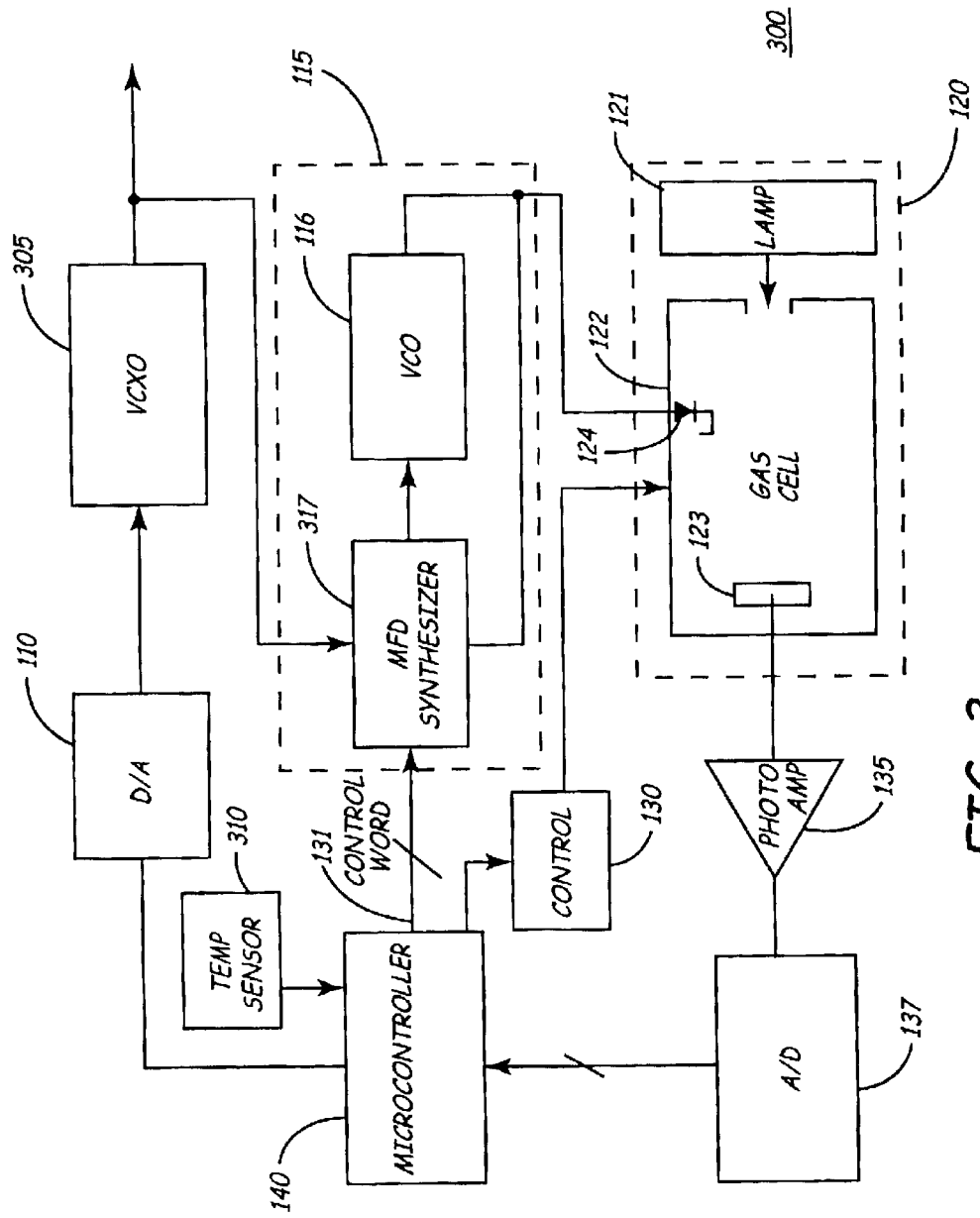
FIG. 3 is a block diagram of a temperature compensated rubidium frequency standard of the present invention.

The digital compensation scheme used in the TCCO with a quartz crystal reference discussed above is adapted for use in a rubidium frequency standard 300 shown in FIG. 3 in the present invention. The function of the temperature compensation in the rubidium frequency standard 300 is similar to that in the TCCO 200. The rubidium frequency standard 100 in the block diagram of FIG. 1 is modified to include the temperature compensation scheme as discussed below.

A temperature sensor 310 is included in the rubidium frequency standard 300 that allows the microcontroller 140 to measure the temperature and find a frequency error setting in a temperature versus frequency error look-up table. The temperature sensor 310 may be a diode or some other method of measuring temperature known in the art including the temperature sensing oscillator 230 of the TCCO 200. The microcontroller 140 then offsets a modulated fractional divider (MFD) frequency synthesizer 317 by the recorded frequency error setting allowing a VCXO 305 to be set to a frequency reducing the frequency error due to the temperature. The rubidium frequency in the physics package 120 is allowed to shift but the VCXO 305 frequency remains on the correct frequency. The OCXO 105 of FIG. 1 is replaced with the VCXO 305 in the present invention.

The RF synthesizer 117 of FIG. 1 may be a modulated fractional divider (MFD) synthesizer 317 due to the fine frequency resolution that can be obtained with this type of synthesizer. The MFD, known in the art, lends itself to integration quite well, which is desirable for the miniaturization of the rubidium frequency standard 300. Other types of frequency synthesizers that have fine frequency resolution may also be used in the rubidium frequency standard 300.

Initially during temperature compensation a high stability reference oscillator such as a crystal oscillator is substituted for the VCXO 305. The rubidium frequency standard 300 is then run over a desired temperature range. The microcontroller 140 adjusts the MFD synthesizer 317 with the control word 131 to find a null point in the photo detector 123 output and then records the synthesizer 317 offset control word 131 along with the temperature at which the setting was found. With the conclusion of the temperature compensation run a compensation table is built and stored in a memory (not shown) that may be in the microcontroller 140 that contains the correct synthesizer 317 offset control word for a given temperature.

When the rubidium frequency standard 300 of the present invention is in a normal run mode the microcontroller 140 measures the temperature with the temperature sensor 310. The microcontroller 140 calculates the correct offset control word 131 for the MFD synthesizer 317 using the temperature versus control word look up table for the measured temperature and offsets the synthesizer 317. The microcontroller 140 sweeps the MFD synthesizer 317 around the correct offset control word while sampling the photo detector 123 output through the analog to digital converter 137. When a null is detected in the photo detector 123 output, the microcontroller 140 adjusts the VCXO 305 frequency so that the VCXO 305 frequency at the photo detector 123 output null matches the MFD synthesizer 317 correct offset control word 131 that is recorded in the compensation table.

The digital compensation scheme of the present invention allows replacement of the ovenized crystal oscillator (OCXO) 105 with a non-ovenized VCXO 305. This reduces the size required of the rubidium frequency standard 300 and also reduces power by the elimination of the oven used to stabilize the crystal oscillator temperature. The oven associated with the OCXO 105 can use several watts of power.

As the light source 121 ages it loses intensity. The intensity of the light source 121 affects the gas cell 122 resonance null point. The null point is found by the microcontroller 140 sweeping the frequency synthesizer 317 though the null point. With the microcontroller 140 constantly monitoring the output of the light source 121, variations of the light source 121 can also be compensated. The microcontroller 140 can also have a table of the light source 121 intensity versus temperature, which is generated at the same time as the other temperature versus frequency data. In addition a table of the light intensity versus frequency shift must be created. By finding the deviation of the light intensity from the original intensity the aging of the light source can be compensated in the same manner as the temperature effects.

The magnetic field sensitivity of a rubidium frequency standard is a result of the hyperfine magnetic resonance on which it depends. The physics package 120 uses an internal longitudinal dc magnetic bias field to orient the Rb atoms and separate the Zeeman sublevels. The frequency varies linearly with the strength of the magnetic field. As the size of the rubidium frequency standard is reduced, the amount of magnetic shielding is reduced, and the proximity of components that may induce magnetic fields is increased. The effect of magnetic fields can be measured by three sensors, one for each plane, and then compensated in much the same way. With inputs from the temperature sensor 310 and the magnetic field sensors, the offset frequency experienced by the physics package 120 to these effects can be minimized. Dynamic temperature effects can also be measured and corrected in much the same manner as the TCCO corrects for temperature effects.

With continued miniaturization, the size of the physics package 120 and its associated oven is reduced, as is the insulation surrounding this oven. As the size of the physics package 120 is reduced, so is the magnetic shielding protecting the gas cell. With these changes the frequency accuracy of the rubidium frequency standard 300 is reduced. The rubidium frequency standard digital compensation scheme of the present invention can then recover the accuracy lost though miniaturization.

It is believed that the temperature compensated rubidium frequency standard of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A rubidium frequency standard with a temperature compensated output signal said rubidium frequency standard comprising:

a voltage controlled crystal oscillator (VCXO) for providing the temperature compensated output signal;

a frequency synthesizer for receiving the output signal from the VCXO as a reference and providing a RF signal;

a physics package for receiving the RF signal from the frequency synthesizer and for providing a light output signal with a null indicating when the RF signal is such that a transition frequency of rubidium is obtained within said physics package;

a temperature sensor for sensing temperature and providing a temperature signal; and a microcontroller for receiving the light output signal, generating a control word for the frequency synthesizer, receiving the temperature signal, and providing an error signal to the VCXO to lock the VCXO to the physics package said microcontroller using the temperature signal to look up a frequency error in a memory to offset said synthesizer control word and adjusting said VCXO frequency to compensate for temperature.

2. The temperature compensated rubidium frequency standard of claim 1 wherein said physics package further comprises:
   a multiplier for multiplying the RF signal to a microwave frequency;
   a light source for providing light;
   a gas cell excited by the microwave frequency, passing the light from the light source, and reducing the light from the light source when the gas cell is excited by the microwave frequency at the transition frequency; and
   a photo detector for detecting the light passed through the gas cell and for providing a light output signal that is at the null when the gas cell is excited at the transition frequency.

3. The rubidium frequency standard of claim 2 wherein the microcontroller calculates the offset control word of the frequency synthesizer, sweeps the synthesizer around the offset control word while sampling the photo detector output, detects the null in the photo detector output, and adjusts the VCXO frequency so that the null frequency matches the synthesizer offset control word that is recorded in the memory.

4. The rubidium frequency standard of claim 3 wherein a compensation table is built and stored in the memory that contains the offset control word for the temperature.

5. The rubidium frequency standard of claim 4 wherein during temperature compensation a high stability reference oscillator is substituted for the VCXO, the rubidium frequency standard is run over a desired temperature range, and the microcontroller adjusts the synthesizer with a control word to find the null point in the photo detector output and then records the synthesizer offset control word along with the temperature at which the setting was found in the compensation table.

6. The rubidium frequency standard of claim 1 wherein the frequency synthesizer is a modulated fraction divider synthesizer.

7. The rubidium frequency standard of claim 2 wherein the microcontroller monitors the light source output, looks up a light source intensity versus temperature and light source intensity versus frequency shift in tables, finds a deviation of the light intensity from an original intensity, and compensates for the intensity variation.

8. A method of compensating for frequency variations in an output signal from a rubidium frequency standard said method comprising the steps of:
   locking a voltage controlled crystal oscillator (VCXO) to a physics package with an error signal;
   sensing temperature with a temperature sensor;
   providing a temperature signal from the temperature sensor;
   looking up a frequency error with a microcontroller in a memory in accordance with the temperature signal;
   generating an offset control word for a frequency synthesizer in the microcontroller to compensate for the temperature; and
   adjusting the VCXO with the error signal to compensate for temperature.

9. The method of compensating for frequency variations in the output signal from the rubidium frequency standard of claim 8 said method further comprising the steps of:
   providing the temperature compensated output signal from the VCXO;
   receiving the output signal from the VCXO as a reference in a frequency synthesizer;
   providing a RF signal from the frequency synthesizer;
   receiving the RF signal in the physics package; and
   providing a light output signal with a null indicating when the RF signal is such that a transition frequency of rubidium is obtained within the physics package.

10. The method of compensating for frequency variations in the output signal from the rubidium frequency standard of claim 9 wherein said microcontroller performs the steps of:
   receiving the light output signal;
   generating a control word for the frequency synthesizer;
   receiving the temperature signal;
   calculating an offset control word for the synthesizer in response to the temperature signal;
   sweeping the synthesizer around the offset control word;
   sampling a photo detector output;
   detecting a null in the photo detector output; and
   adjusting the VCXO frequency so that the null frequency matches the offset control word that is recorded in the memory.

11. The method of compensating for frequency variations in an output signal from the rubidium frequency standard of claim 10 said method further comprising the steps of:
   multiplying the RF signal to a microwave frequency with a multiplier;
   providing light from a light source;
   exciting a gas cell by the microwave frequency;
   passing the light from the light source through the gas cell;
   reducing the light from the light source when the gas cell is excited by the microwave frequency at the transition frequency;
   detecting the light passed through the gas cell with a photo detector; and
   providing the light output signal that is at the null when the gas cell is excited at the transition frequency.

12. The method of compensating for frequency variations in the output signal from the rubidium frequency standard of claim 10 said method further comprising the steps of building and storing a compensation table in the memory containing the offset control word for the temperature.

13. The method of compensating for frequency variations in the output signal from the rubidium frequency standard of claim 12 wherein during temperature compensation said method further comprising the steps of:
   substituting a high stability reference oscillator for the VCXO;
   running the rubidium frequency standard over a desired temperature range;
   adjusting the synthesizer with a control word to find the null point in the photo detector output; and
   recording the offset control word along with the temperature at which the setting was found in the compensation table.

14. A rubidium frequency standard having a physics package that receives an RF signal and provides a light output signal with a null indicating when the RF signal is such that a transition frequency of rubidium is obtained within said physics package wherein said rubidium frequency standard output signal is compensated for frequency variations in temperature said rubidium frequency standard further comprising:

a voltage controlled crystal oscillator (VXCO) locked to the physics package by an error signal and for providing the output signal;

a temperature sensor for sensing temperature and providing a temperature signal;

a frequency synthesizer for receiving the output signal from the VCXO as a reference and providing the RF signal to the physics package; and a microcontroller for looking up a frequency error in a memory in accordance with the temperature signal, generating an offset control word setting for the frequency synthesizer to compensate for the temperature, and adjusting the VCXO with the error signal to compensate for temperature.

15. The rubidium frequency standard of claim 14 wherein the microcontroller calculating the offset control word setting of the frequency synthesizer, sweeps the synthesizer around the offset control word setting while sampling a photo detector output in the physics package, detects the null in the photo detector output, and adjusts the VCXO frequency so that the null frequency matches the offset control word that is recorded in the memory.

16. The rubidium frequency standard of claim 15 wherein a compensation table is built and stored in the memory that contains the offset control word setting for the temperature.

17. The rubidium frequency standard of claim 14 wherein during temperature compensation a high stability reference oscillator is substituted for the VCXO, the rubidium frequency standard is run over a desired temperature range, and the microcontroller adjusts the synthesizer with a control word to find a null point in a photo detector output and then records the offset control word setting along with the temperature at which the setting was found in the compensation table.

18. The rubidium frequency standard of claim 14 wherein the frequency synthesizer is a modulated fraction divider synthesizer.

* * * * *